(12) United States Patent
Beck (10) Patent No.: US 9,929,295 B2
(45) Date of Patent: Mar. 27, 2018

(54) METHODS OF HERMETICALLY SEALING PHOTOVOLTAIC MODULES

(71) Applicant: Markus Eberhard Beck, Scotts Valley, CA (US)

(72) Inventor: Markus Eberhard Beck, Scotts Valley, CA (US)

(73) Assignee: SIVA POWER, INC., San Jose, CA (US)

(*) Notice: Subject to any disclaimer, the term of this patent is extended or adjusted under 35 U.S.C. 154(b) by 6 days.

(21) Appl. No.: 14/986,983

(22) Filed: Jan. 4, 2016

(65) Prior Publication Data

US 2016/0118520 A1  Apr. 28, 2016

Related U.S. Application Data

(63) Continuation of application No. 14/457,922, filed on Aug. 12, 2014, now Pat. No. 9,257,585.

(60) Provisional application No. 61/868,203, filed on Aug. 21, 2013.

(51) Int. Cl.

| | |
|---|---|
| *H01L 31/048* | (2014.01) |
| *H01L 31/02* | (2006.01) |
| *H01L 31/18* | (2006.01) |
| *H01L 31/0445* | (2014.01) |
| *H01L 31/028* | (2006.01) |
| *H01L 31/0296* | (2006.01) |
| *H01L 31/0304* | (2006.01) |
| *H01L 31/032* | (2006.01) |
| *H01L 31/068* | (2012.01) |
| *H01L 31/075* | (2012.01) |
| *H01G 9/20* | (2006.01) |
| *H01L 51/44* | (2006.01) |

(52) U.S. Cl.
CPC ....... *H01L 31/0488* (2013.01); *H01G 9/2077* (2013.01); *H01L 31/0201* (2013.01); *H01L 31/028* (2013.01); *H01L 31/0296* (2013.01); *H01L 31/0304* (2013.01); *H01L 31/0322* (2013.01); *H01L 31/0326* (2013.01); *H01L 31/048* (2013.01); *H01L 31/0445* (2014.12); *H01L 31/068* (2013.01); *H01L 31/075* (2013.01); *H01L 31/18* (2013.01); *H01L 31/186* (2013.01); *H01G 9/2031* (2013.01); *H01L 51/448* (2013.01); *Y02E 10/542* (2013.01); *Y02P 70/521* (2015.11)

(58) Field of Classification Search
CPC ........... H01L 31/0203; H01L 31/02167; H01L 31/0488
USPC ...................................................... 438/26, 64
See application file for complete search history.

(56) References Cited

U.S. PATENT DOCUMENTS

2007/0039644 A1* 2/2007 Lee ..................... C07F 15/0053
                                                          136/252
2009/0308105 A1* 12/2009 Pastel ................. H01L 51/5246
                                                          65/42

(Continued)

*Primary Examiner* — Eliseo Ramos Feliciano
*Assistant Examiner* — Mikka Liu
(74) *Attorney, Agent, or Firm* — Morgan, Lewis & Bockius LLP (57) ABSTRACT

In various embodiments, photovoltaic modules are hermetically sealed by providing a first glass sheet, a photovoltaic device disposed on the first glass sheet, and a second glass sheet, a gap being defined between the first and second glass sheets, disposing a glass powder within the gap, and heating the powder to seal the glass sheets.

23 Claims, 6 Drawing Sheets

(56) References Cited

U.S. PATENT DOCUMENTS

| | | | |
|---|---|---|---|
| 2011/0008947 A1* | 1/2011 | Cunningham | B23K 26/0853 438/463 |
| 2011/0306161 A1* | 12/2011 | Magalhaes Mendes | H01G 9/2077 438/66 |
| 2012/0006390 A1* | 1/2012 | Huo | H01L 21/0237 136/255 |
| 2012/0043814 A1* | 2/2012 | Deligianni | H01L 31/02245 307/43 |
| 2012/0107995 A1* | 5/2012 | Niiyama | H01L 31/048 438/64 |
| 2012/0152349 A1* | 6/2012 | Cao | H01L 31/048 136/259 |
| 2013/0104980 A1* | 5/2013 | Sridharan | B81C 1/00317 136/259 |
| 2013/0111953 A1* | 5/2013 | Maloney | H01L 21/50 65/43 |

\* cited by examiner

METHODS OF HERMETICALLY SEALING PHOTOVOLTAIC MODULES

RELATED APPLICATIONS

This application is a continuation of U.S. patent application Ser. No. 14/457,922, filed Aug. 12, 2014, which claims the benefit of and priority to U.S. Provisional Patent Application No. 61/868,203, filed Aug. 21, 2013, the entire disclosure of which is hereby incorporated herein by reference.

TECHNICAL FIELD

In various embodiments, the present invention relates to photovoltaic devices, and in particular to glass-sealed photovoltaic modules.

BACKGROUND

Current state-of-the-art photovoltaic (PV) modules based on silicon (Si) wafer technology employ a front glass/encapsulant/wafer/encapsulant/backsheet structure. Polyvinyl fluoride (e.g., Tedlar® from DuPont) is the most commonly used backsheet in wafer-based Si PV modules. This material is inherently transparent for water vapor and gases—i.e., it does not enable or maintain a hermetic seal. Thin-film PV modules based on amorphous Si (a-Si), CdTe, or copper indium gallium selenide ($CuIn_xGa_{1-x}Se_2$ or CIGS) most often utilize a glass-glass architecture with one of the glass sheets either serving as the substrate (CIGS) or superstrate (a-Si, CdTe) onto which the active PV material is deposited directly. The function of the second glass sheet is to serve as either the protective top (CIGS) or back cover (a-Si, CdTe). Both sheets of glass are held together with a single encapsulant layer. For practical purposes the 1.8-4 mm-thick sheets of glass are impermeable to water and gases. However, moisture and gas ingress can occur along the edges of the glass/encapsulant/glass sandwich. Exposure to such moisture can result in issues such as corrosion, decreased minority carrier lifetime, and increased series resistance, deleteriously impacting the performance and lifetime of the PV module. To slow down moisture ingress and gas permeation, butyl-based edge seals are typically applied, as butyl rubber has water vapor transmission rates (WVTR) on the order of $10^{-6}$ g/m²-day, orders of magnitude below the WVTR for typical encapsulant materials.

While the WVTR value for butyl is considered to be adequate for long-term protection, the overall vulnerability of a device to moisture usually derives less from the bulk diffusivity of the butyl than from the durability of the interface between the butyl and the glass. Adhesion promoters to establish coupling of the polymer to the glass are typically added to the butyl, but the resulting bonds tend to be weak and easily damaged by ultraviolet radiation, prolonged exposure to elevated temperatures, and humidity—i.e., conditions in which PV modules are commonly deployed. Stresses present between the two sheets of glass can further strain the glass/butyl interfaces. Hence, even for such edge-sealed glass-glass structures, moisture penetration is a common field failure mode. Thus, there is a need for hermetically sealed modules and techniques that enable environmental protection of thin-film PV devices and which are superior to current butyl-rubber-based solutions.

SUMMARY

Embodiments of the present invention provide PV modules hermetically sealed against environmental contamination via edge seals consisting entirely of glass. While preferred embodiments of the invention utilize "thin-film" PV modules featuring PV devices based on CIGS, a-Si, or CdTe, other embodiments of the invention utilize PV devices based on crystalline Si (e.g., in wafer or ribbon form) or III-V semiconductors such as GaAs or InP (e.g., in wafer form) or solid-state dye-sensitized perovskite material (organic-inorganic hybrid). As utilized herein, "PV devices" are the active PV materials within PV modules, and these typically include or consist essentially of materials forming one or more p-n or p-i-n junctions that each absorb at least a portion of the solar spectrum and convert it into electricity. In preferred embodiments, a powder consisting essentially of or consisting of glass is utilized to seal a PV device fronted and backed by glass sheets, thereby forming a sealed PV module. The glass powder is locally heated to a temperature higher than the melting point, glass transition temperature, and/or softening point of the powder such that the powder softens and/or flows into a unified mass that bonds with the glass sheets to form a hermetic seal.

Advantageously, embodiments of the present invention increase the active area of the PV module, and hence the power output for a fixed PV module size. Typical safety requirements, e.g., IEC or UL, mandate a minimum insulation distance from the current-carrying live parts inside a PV module to the outside edge of the module—i.e., the clearance and creepage distance. Such "edge delete" losses depend on various aspects such as the total system voltage or micro-environment (e.g., pollution degree and altitude), but are typically at the order of 8-15 mm. As conventional polymeric edge seals can fail over time, the insulation against electrical shock is compromised and, in the case of moisture ingress, current can track over the glass or polymer surface from the module circuit to its edge. In contrast, the glass-based seals in accordance with embodiments of the present invention are truly durable cemented joints retaining their superior electrical insulation properties over time. These seals allow the clearance—i.e., the edge delete—to be smaller, in turn proportionally increasing the power output from the PV module for the same total area.

In addition, the polymeric encapsulant (filler sheet)—e.g., EVA, PVB, polyolefin, ionomers, TPU—conventionally utilized to bond glass sheets together may be eliminated in accordance with embodiments of the present invention. After the cost of the glass sheets, such filler sheets are typically the most expensive elements of thin-film PV modules. Thus, embodiments of the invention enable significant reductions in material cost. Furthermore, elimination of polymeric filler sheets and the conventional butyl rubber edge seals also enables PV modules in accordance with embodiments of the invention to obtain higher fire ratings. Moreover, elimination of such conventional polymer-based filler sheets and edge seals obviates the need for the slow and capital-intensive lamination step, resulting in additional manufacturing cost savings for PV modules in accordance with embodiments of the present invention.

PV modules that are hermetically sealed in accordance with embodiments of the present invention exhibit advantageously enhanced durability in climates and/or ambient conditions that have high relative humidity, e.g., coastal or equatorial locations. In addition, since PV modules and devices sealed in accordance with embodiments of the invention do not rely on seals based on glass-polymer adhesion, they are less susceptible than to fatigue under conditions such as UV radiation, elevated temperature, and high humidity or moisture levels. Glass-polymer bonds also tend to be susceptible to failure due to mechanical stresses from, e.g., etch pinch during module lamination.

In an aspect, embodiments of the invention feature a photovoltaic module that includes, consists essentially of, or consists of a first glass sheet, a photovoltaic device disposed on the first glass sheet, a second glass sheet disposed over and in contact with at least a portion of the photovoltaic device, and a layer of melted glass powder. The first glass sheet and the second glass sheet have a gap therebetween spanned, over only a portion of an area of the gap, by the photovoltaic device, and the layer of melted glass powder seals the gap between the first and second glass sheets at an edge region proximate an edge of at least one of the first or second glass sheets so as to hermetically seal the photovoltaic device.

Embodiments of the invention may include one or more of the following in any of a variety of different combinations. The photovoltaic device may include, consist essentially of, or consist of an active region including, consisting essentially of, or consisting of one or more p-n or p-i-n junctions. The photovoltaic module may include (i) a first substrate layer disposed between the active region and the first glass sheet and/or (ii) a second substrate layer disposed between the active region and the second glass sheet. The first and/or second substrate layers may each include, consist essentially of, or consist of a metal foil and/or a polymer layer. A conductive bus ribbon may be electrically coupled to the photovoltaic device and may extend out from the first and second glass sheets in contact with the layer of melted glass powder. In a region where the conductive bus ribbon extends out from the first and second glass sheets, the conductive bus ribbon may be (i) disposed in contact with both the first and second glass sheets, (ii) disposed in contact with the first glass sheet and the layer of melted glass powder, but not with the second glass sheet, (iii) disposed in contact with the second glass sheet and the layer of melted glass powder, but not with the first glass sheet, or (iv) disposed in contact with the layer of melted glass powder, but not with the first or second glass sheets. The melted glass powder may include a colorant or other absorber utilized to, e.g., locally increase the absorption of particular wavelengths of light.

The photovoltaic device may include, consist essentially of, or consist of multiple junctions, each of which is a p-n junction or a p-i-n junction. The photovoltaic device may be a thin-film photovoltaic device that includes, consists essentially of, or consists of amorphous silicon. The photovoltaic device may be a thin-film photovoltaic device that includes, consists essentially of, or consists of CdTe. The photovoltaic device may be a thin-film photovoltaic device that includes, consists essentially of, or consists of chalcopyrite ($Cu(In,Ga)(S,Se)_2$). The photovoltaic device may be a thin-film photovoltaic device that includes, consists essentially of, or consists of kesterite ($Cu_2(Zn,Fe)Sn(S,Se)_4$). The photovoltaic device may include, consist essentially of, or consist of crystalline silicon and/or GaAs. The photovoltaic device may include, consist essentially of, or consist of solid-state dye-sensitized perovskite material (organic-inorganic hybrid). The composition of the melted glass powder may be substantially the same as the composition of the first and/or second glass sheets. The composition of the melted glass powder may be different from a composition of either of the first or second glass sheets (i.e., different from the compositions of both of the first and second glass sheets).

In another aspect, embodiments of the invention feature a method of hermetically sealing a photovoltaic module. First, a structure is provided. The structure includes, consists essentially of, or consists of a first glass sheet, a photovoltaic device disposed on the first glass sheet, and a second glass sheet disposed over and in contact with at least a portion of the photovoltaic device, the first glass sheet and the second glass sheet defining a gap therebetween spanned, over only a portion of an area of the gap, by the photovoltaic device. A powder is disposed within the gap at an edge region proximate an edge of at least one of the first or second glass sheets. The powder includes, consists essentially of, or consists of glass. The powder is heated within the gap to seal the first and second glass sheets at the edge region with a layer of melted glass powder.

Embodiments of the invention may include one or more of the following in any of a variety of different combinations. Heating the powder may include, consist essentially of, or consist of application of laser energy to the powder (e.g., through one or both of the first or second glass sheets). The photovoltaic device may include, consist essentially of, or consist of an active region including, consisting essentially of, or consisting of one or more p-n or p-i-n junctions. The photovoltaic module may include (i) a first substrate layer disposed between the active region and the first glass sheet and/or (ii) a second substrate layer disposed between the active region and the second glass sheet. The first and/or second substrate layers may each include, consist essentially of, or consist of a metal foil and/or a polymer layer. A conductive bus ribbon may be electrically coupled to the photovoltaic device and may extend out from the first and second glass sheets in contact with the layer of melted glass powder (i.e., the powder may be melted at least partially around the bus ribbon in the edge region). In a region where the conductive bus ribbon extends out from the first and second glass sheets, the conductive bus ribbon may be (i) disposed in contact with both the first and second glass sheets, (ii) disposed in contact with the first glass sheet and the layer of melted glass powder, but not with the second glass sheet, (iii) disposed in contact with the second glass sheet and the layer of melted glass powder, but not with the first glass sheet, or (iv) disposed in contact with the layer of melted glass powder, but not with the first or second glass sheets. The powder may include a colorant or other absorber utilized to, e.g., locally increase the absorption of particular wavelengths of light.

The photovoltaic device may include, consist essentially of, or consist of multiple junctions, each of which is a p-n junction or a p-i-n junction. The photovoltaic device may be a thin-film photovoltaic device that includes, consists essentially of, or consists of amorphous silicon. The photovoltaic device may be a thin-film photovoltaic device that includes, consists essentially of, or consists of CdTe. The photovoltaic device may be a thin-film photovoltaic device that includes, consists essentially of, or consists of chalcopyrite ($Cu(In,Ga)(S,Se)_2$). The photovoltaic device may be a thin-film photovoltaic device that includes, consists essentially of, or consists of kesterite ($Cu_2(Zn,Fe)Sn(S,Se)_4$). The photovoltaic device may include, consist essentially of, or consist of crystalline silicon and/or GaAs. The photovoltaic device may include, consist essentially of, or consist of solid-state dye-sensitized perovskite material (organic-inorganic hybrid). The composition of the melted glass powder may be substantially the same as the composition of the first and/or second glass sheets. The composition of the melted glass powder may be different from a composition of either of the first or second glass sheets (i.e., different from the compositions of both of the first and second glass sheets).

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately" and "substantially" mean±10%, and in some embodiments, ±5%. The term "consists essentially of" means excluding other materials that contribute to function, unless otherwise defined herein. Nonetheless, such other materials may be present, collectively or individually, in trace amounts. For example, a structure consisting essentially of glass will generally include only glass and only unintentional impurities (which may be metallic or non-metallic) that may be detectable via chemical analysis but do not contribute to function. For example, a powder or seal consisting essentially of glass typically does not incorporate organic fillers, binders, solvents, glass frit, frit material(s), glass solder, and/or melting-point reduction agents such as Pb.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
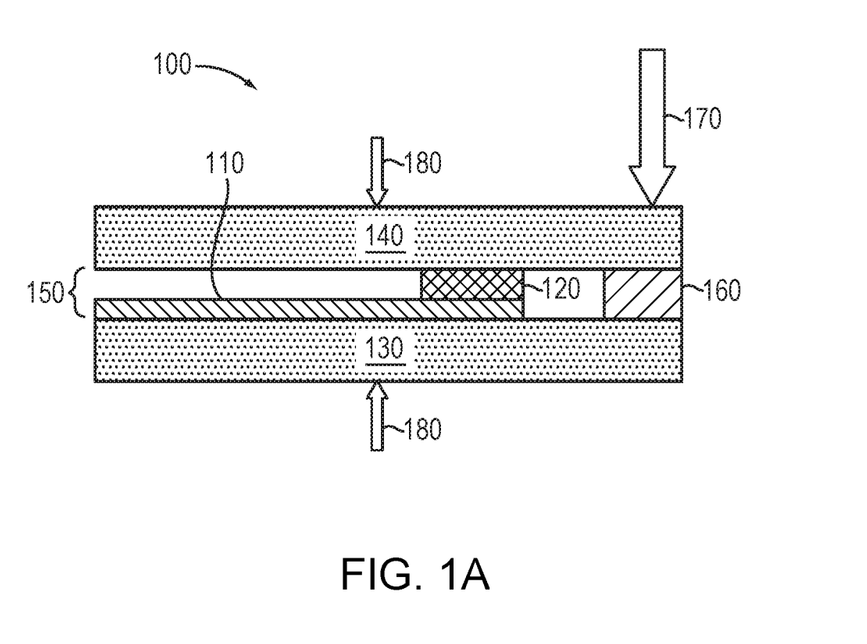
FIG. 1A is a schematic cross-section of a portion of a photovoltaic module being sealed via application of thermal energy in accordance with various embodiments of the invention.
Figure 2A:
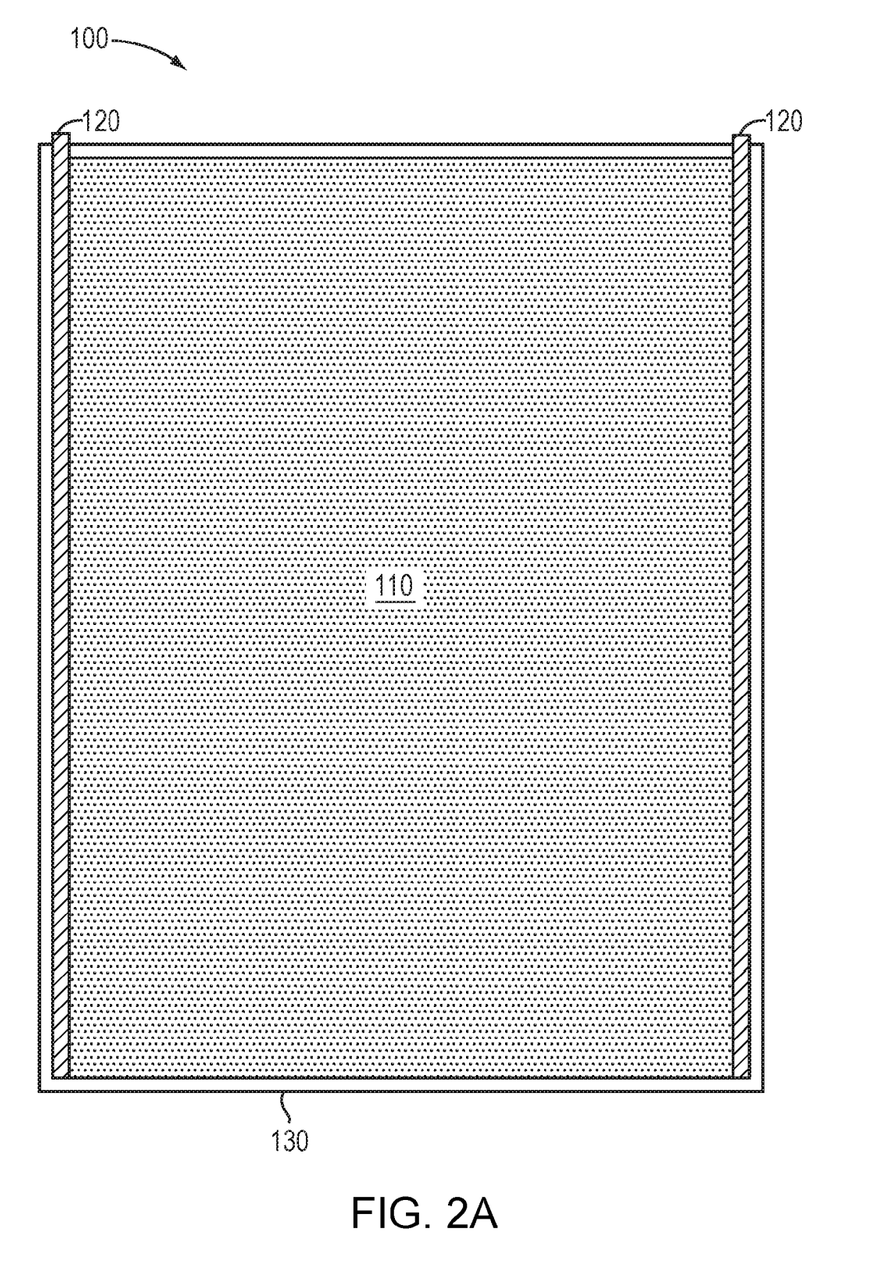
FIG. 2A is a schematic plan view of a photovoltaic module in accordance with various embodiments of the invention.

FIG. 1A illustrates a portion of a PV module 100 being sealed at an edge region via application of thermal energy in accordance with embodiments of the present invention. As shown, the PV module 100 includes an active PV device 110, one or more conductive bus ribbons 120, a lower glass sheet 130, and an upper glass sheet 140. While preferred embodiments of the invention utilize thin-film PV modules 100 featuring PV devices 110 based on CIGS, a-Si, or CdTe, other embodiments of the invention utilize PV devices 110 based on crystalline Si (e.g., in wafer or ribbon form) or III-V semiconductors such as GaAs or InP (e.g., in wafer form) or solid-state dye-sensitized perovskite material (organic-inorganic hybrid incorporating a dye such as hybrid perovskite $CH_3NH_3PbI_3$ dye). The one or more bus ribbons 120 are electrically coupled to the PV device 110 and extend beyond the lower glass sheet 130 and upper glass sheet 140 (see FIG. 2A), thereby enabling external electrical contact to the PV device 110. The bus ribbon(s) may include, consist essentially of, or consist of one or more highly electrically conductive metals, e.g., aluminum, copper, or a multilayer stack of one or more aluminum layers and one or more copper layers. In various embodiments, conventional alkali alkaline-earth silicate glasses (i.e., soda lime glass) are utilized as one or both of the lower glass sheet 130 and the upper glass sheet 140, as such glasses are less expensive than, e.g., alkali-lead silicate glass, alkaline-earth aluminosilicate glass, and borosilicate glass, any of which might also be utilized. In an example, one or both of the lower glass sheet 130 and the upper glass sheet 140 have a composition that is approximately 71% $SiO_2$, approximately 15% alkali (e.g., primarily $Na_2O$, but may also include $K_2O$), approximately 13-16% alkaline earths (e.g., CaO+MgO), approximately 0-2% $Al_2O_3$, and, in some embodiments, BaO.

Figure 1B:
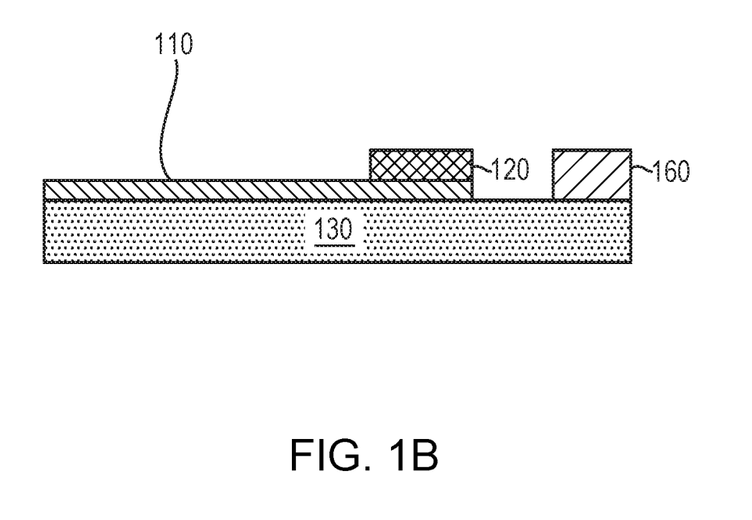
FIG. 1B is a schematic cross-section of a portion of a photovoltaic module after application of a glass sealing powder and before application of an upper glass sheet in accordance with various embodiments of the invention.

As shown in FIG. 1A, a gap 150 between the glass sheets 130, 140 is partially or substantially filled with a glass powder 160 at or near the edge of at least one of the glass sheets 130, 140, and the glass powder 160 is then melted via application of thermal energy 170. The glass powder 160 may be dispensed within the gap 150 (or on at least one of the glass sheets 130, 140 in the vicinity of gap 150 prior to one or both of the glass sheets 130, 140 being applied to the PV device 110) as a bead. For example, as shown in FIG. 1B, the glass powder 160 may be applied to the lower glass sheet 130 before application of the upper glass sheet 140; FIG. 1A depicts the structure of FIG. 1B after application of the upper glass sheet 140. In various embodiments of the invention, the gap 150 between the glass sheets 130, 140 has a thickness (i.e., height) between approximately 50 µm and approximately 500 µm, for example, between approximately 50 µm and 100 µm. The glass powder 160 may have a grain size (or range of grain sizes) optimized to allow fast melting/fusing and to provide a geometrically stable powder track (e.g., width and height) during powder dispense. For example, the glass powder 160 may have a grain size between approximately 0.1 µm and approximately 10 µm, or even between approximately 0.1 µm and 1 µm. In preferred embodiments of the invention, the glass powder 160 does not require any preconditioning after it has been dispensed onto one or both of the glass sheets 130, 140, i.e. the upper glass sheet 140 may be placed on top immediately after the glass powder 160 is dispensed, and the sealing step is conducted in one operation.

The melted glass powder 160 fuses into a solid glass seal filling the gap 150 between the sheets 130, 140 and bonding to the sheets 130, 140, thereby forming a hermetic seal that is much more durable than similar seals utilizing polymer-based fills. In addition, the glass powder 160 may consist entirely or essentially of glass, in contrast with glass-frit materials that incorporate organic fillers, binders, solvents, and/or melting-point reduction agents such as Pb. The glass powder may include colorants or other absorbers utilized to locally increase the absorption of particular wavelengths of light. However, in preferred embodiments, the glass powder 160 utilized to seal the gap 150 has the same composition as at least one of the glass sheets 130, 140. The glass powder 160 may include, consist essentially of, or consist of a low-melting glass that fuses with glass sheets 130, 140 upon melting. The melting point of the glass powder 160 may be, for example, between approximately 200° C. and approximately 550° C., or even between approximately 200° C. and approximately 400° C. In some embodiments, the glass powder 160 includes, consists essentially of, or consists of a zinc-silicoborate glass and/or a binary or ternary mixture of thallium, arsenic and sulfur.

In preferred embodiments of the invention, pressure 180 is applied to one or both of the glass sheets 130, 140 in order to facilitate seal formation when the glass powder 160 is heated. Moreover, various embodiments utilize laser energy as the thermal energy 170 to heat and melt the glass powder 160 during seal formation. The laser utilized to impart the thermal energy 170 may emit substantially red light. The laser energy 170 may be applied via one or multiple passes along the edges of glass sheets 130, 140 by a laser, depending upon how well the beam energy is coupled into the glass powder 160 and how best to minimize any thermally induced stress in the glass sheets 130, 140 along the seal. In some embodiments, the laser energy 170 is pulsed in order to prevent excess heating of the PV device 110 and/or other parts of module 100 away from the edge region being sealed.

In other embodiments, other techniques for localized heating, e.g., inductive heating or application of a torch or other heat source, are used to partially or substantially completely melt the glass powder 160. While the glass powder 160 is at least partially melted to form the hermetic edge seal, the PV device 110 within the module 100 is preferably not exposed to temperatures sufficiently elevated to damage or degrade the device (via, e.g., interdiffusion, melting, etc.). For example, in various embodiments of the present invention, the localized heating temperature does not exceed 400-500° C. for times of ≤1 minute, does not exceed 300-400° C. for times of ≤1-3 minutes, and/or does not exceed 200-300° C. for times of ≤3-10 minutes.

Figure 2B:
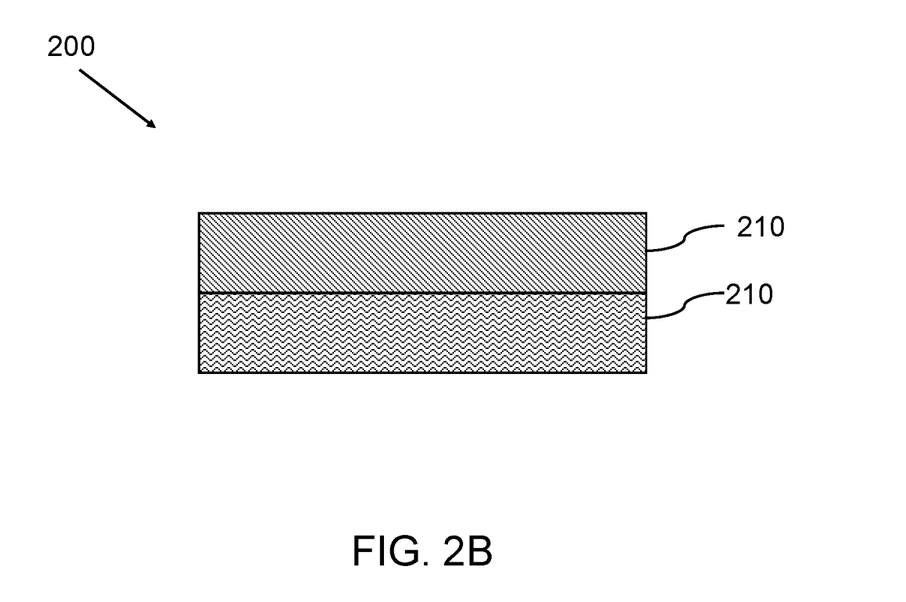
FIG. 2B is a schematic cross-section of an active region of a photovoltaic device in accordance with various embodiments of the invention.
Figure 2C:
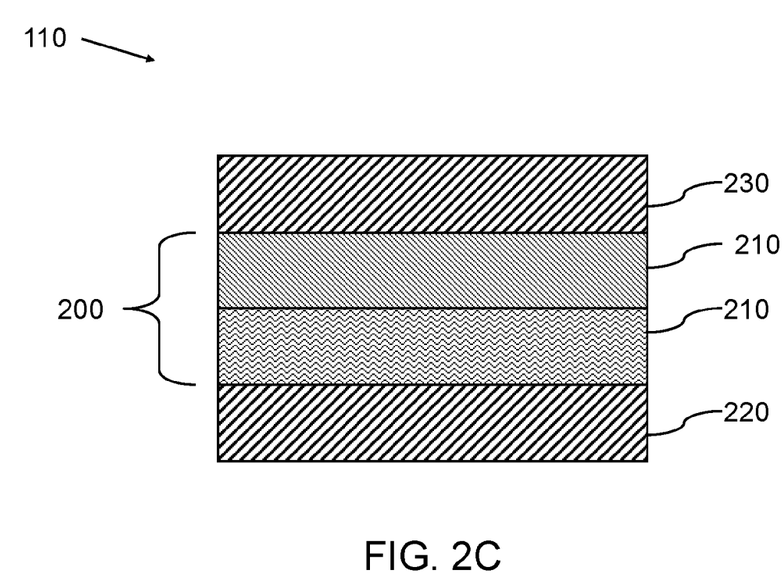
FIG. 2C is a schematic cross-section of a photovoltaic device in accordance with various embodiments of the invention.

As mentioned above, in order to enable electrical contact between the encapsulated PV device 110 and outside electronics and/or systems, one or more conductive bus ribbons 120 may be electrically coupled to the sealed PV device 110 and extend out of the sealed module 100 through the layer of melted glass powder 160. An example is shown in the plan view of FIG. 2A, in which upper glass sheet 140 is omitted for clarity. The PV device 110 itself includes or consists essentially of one or more p-n and/or p-i-n junctions (i.e., homojunctions and/or heterojunctions), and may be fabricated from a-Si, CdTe, or a chalcopyrite (Cu(In,Ga)(S, Se)$_2$) such as CIGS or a kesterite (Cu$_2$(Zn,Fe)Sn(S,Se)$_4$) such as CZTS (copper zinc tin sulfide). For example, as shown in FIG. 2B, an active region 200 of the PV device 110 may include or consist essentially of multiple junctions 210, and each junction 210 may be, for example, a p-n junction or a p-i-n junction. Other embodiments of the invention utilize PV devices 110 based on crystalline Si (e.g., in wafer or ribbon form) or III-V semiconductors such as GaAs or InP (e.g., in wafer form) or solid-state dye-sensitized perovskite material (organic-inorganic hybrid). The junction(s) of PV device 110 may be in direct contact with one or both of the glass sheets 130, 140 (if, e.g., the glass sheets 130, 140 are utilized as a substrate or superstrate for the PV device 110), or the PV device 110 may incorporate a substrate layer (e.g., a foil of a metal or another conductor, or of a polymer such as polyimide) below and/or above the PV device junctions and in contact with one or both of the glass sheets 130, 140. For example, as shown in FIG. 2C, the PV device 110 may include or consist essentially of active region 200 sandwiched between a lower substrate 220 and an upper substrate 230. In other embodiments, lower substrate 220 and/or upper substrate 230 may be omitted. In embodiments in which a substrate layer is disposed above the PV device junctions, the "substrate" is understood to include "superstrate" configurations as they are known in the art.

Figure 3A:
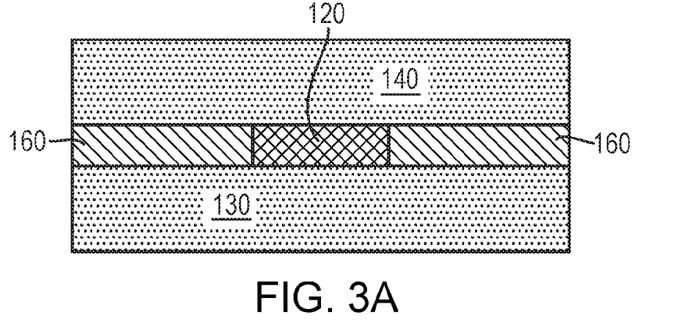
FIGS. 3A-3D are schematic cross-sections of edge portions of sealed photovoltaic modules in accordance with various embodiments of the invention.
Figure 3B:
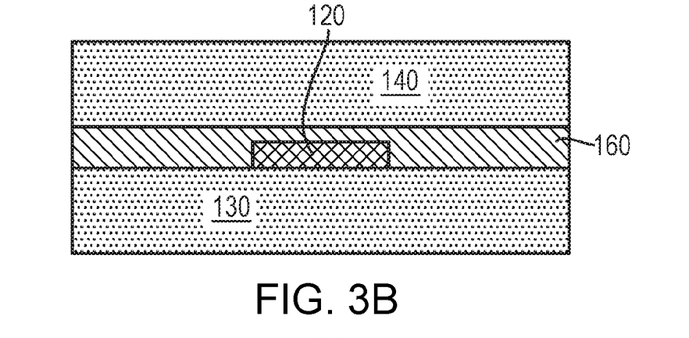
Figure 3C:
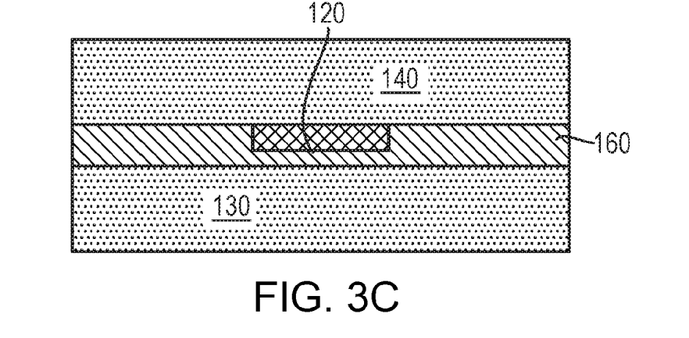
Figure 3D:
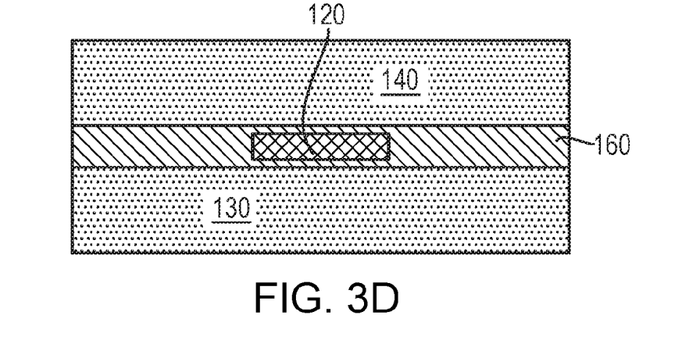

As shown in FIGS. 3A-3D, the conductive bus ribbon 120 and glass-powder seal 160 may have any of several different configurations. For example, in the configuration depicted in FIG. 3A, the conductive bus ribbon 120 is in contact with both the upper glass sheet 140 and the lower glass sheet 130, and the glass powder 160 seals the remaining portion of the gap 150 between the glass sheets 130, 140 and contacts the bus ribbon 120. In FIGS. 3B and 3C, the bus ribbon 120 is in contact with only the lower glass sheet 130 (FIG. 3B) or upper glass sheet 140 (FIG. 3C), and the glass powder 160 seals the remaining portion of the gap 150 between the glass sheets 130, 140 and above or below the bus ribbon 120. In FIG. 3D, the bus ribbon 120 extends through the glass-powder seal 160 without contacting either of the glass sheets 130, 140. Depending upon the compositions of the bus ribbon 120 and the glass sheets 130, 140, the configurations of FIGS. 3B-3D may result in a metal-glass seal between the bus ribbon 120 and the glass powder 160 upon application of the localized thermal energy 170.

During the edge-seal formation, the surfaces of the glass sheets 130, 140 to be joined together may be treated (e.g., cleaned to remove bond-impeding contamination or have thin surface layers removed) prior to the application of force 180 and localized heating 170. The force 180 is typically applied to the surface of at least one of the glass sheets 130, 140 until the glass powder 160 has melted, sealed the edge region, and then cooled to form a solid (or at least semi-solid) phase. After the localized heating and seal formation, any localized stress at the sealed edge region may be at least partially reduced via annealing of the sealed module 100 (or at least the sealed edge region) at a moderate temperature (e.g., at a temperature lower than the melting point and/or the softening point of the glass powder 160).

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method of hermetically sealing a photovoltaic module, the method comprising:
   providing a structure comprising:
      a first glass sheet,
      a photovoltaic device disposed on the first glass sheet, and
      a second glass sheet disposed over the photovoltaic device, the first glass sheet and the second glass sheet thereby defining a gap at least a portion of which is spanned by the photovoltaic device;
   disposing only a powder consisting essentially of glass within the gap at an edge region proximate an edge of at least one of the first glass sheet or the second glass sheet, the powder being free of glass frit, frit material, organic fillers, binders, and solvents such that, before any heating of the powder, the gap and the first and second glass sheets are free of glass frit, frit material, organic fillers, binders, and solvents;
   heating the powder within the gap to seal the first and second glass sheets at the edge region with a layer of melted glass powder; and while heating the powder within the gap, applying pressure to (i) the first glass sheet, (ii) the second glass sheet, or (iii) both the first and second glass sheets,
wherein a composition of the powder is the same as a composition of the first glass sheet and/or a composition of the second glass sheet.

2. The method of claim 1, wherein heating the powder comprises application of laser energy to the powder.

3. The method of claim 1, wherein the photovoltaic device comprises an active region comprising one or more p-n or p-i-n junctions.

4. The method of claim 3, wherein the photovoltaic device comprises (i) a first substrate layer disposed between the active region and the first glass sheet, (ii) a second substrate layer disposed between the active region and the second glass sheet, or (iii) a first substrate layer disposed between the active region and the first glass sheet and a second substrate layer disposed between the active region and the second glass sheet.

5. The method of claim 4, wherein (i) the first substrate layer comprises a metal foil or a polymer layer, (ii) the second substrate layer comprises a metal foil or a polymer layer, or (iii) both the first and second substrate layers comprise a metal foil or a polymer layer.

6. The method of claim 1, wherein a conductive bus ribbon electrically coupled to the photovoltaic device extends out from the first and second glass sheets through the sealed edge region.

7. The method of claim 6, wherein, at the sealed edge region, the conductive bus ribbon is disposed in direct mechanical contact with the first glass sheet and the layer of melted glass powder, but not with the second glass sheet.

8. The method of claim 6, wherein, at the sealed edge region, the conductive bus ribbon is disposed in direct mechanical contact with the second glass sheet and the layer of melted glass powder, but not with the first glass sheet.

9. The method of claim 6, wherein, at the sealed edge region, the conductive bus ribbon is disposed in direct mechanical contact with the layer of melted glass powder, but not with the first or second glass sheets.

10. The method of claim 6, wherein (i) at the sealed edge region, the conductive bus ribbon is disposed in direct mechanical contact with both the first and second glass sheets, (ii) the conductive bus ribbon is a single conductive bus ribbon, (iii) the photovoltaic device is a single photovoltaic device, (iv) the single conductive bus ribbon is the only conductive bus ribbon electrically coupled to the single photovoltaic device, (v) the single photovoltaic device is the only photovoltaic device disposed between the first and second glass sheets, and (vi) the single conductive bus ribbon is the only conductive bus ribbon partially disposed between the first and second glass sheets and extending out therefrom.

11. The method of claim 10, wherein the single photovoltaic device is in direct mechanical contact with one of the first and second glass sheets but not both of the first and second glass sheets.

12. The method of claim 1, wherein the photovoltaic device comprises a plurality of junctions, each junction being a p-n junction or a p-i-n junction.

13. The method of claim 1, wherein the photovoltaic device is a thin-film photovoltaic device comprising amorphous silicon.

14. The method of claim 1, wherein the photovoltaic device is a thin-film photovoltaic device comprising CdTe.

15. The method of claim 1, wherein the photovoltaic device is a thin-film photovoltaic device comprising chalcopyrite $(Cu(In,Ga)(S,Se)_2)$.

16. The method of claim 1, wherein the photovoltaic device is a thin-film photovoltaic device comprising kesterite $(Cu_2(Zn,Fe)Sn(S,Se)_4)$.

17. The method of claim 1, wherein the photovoltaic device comprises at least one of crystalline silicon, GaAs, or solid-state dye-sensitized perovskite material.

18. The method of claim 1, wherein disposing the powder within the gap comprises (i) disposing the powder on the edge of the first glass sheet proximate the photovoltaic device, and (ii) thereafter, disposing the second glass sheet over the photovoltaic device and the powder before heating the powder within the gap.

19. The method of claim 1, wherein the powder is free of glass solder.

20. The method of claim 1, wherein the powder is free of lead.

21. The method of claim 1, wherein the powder is free of melting-point reduction agents.

22. A method of hermetically sealing a photovoltaic module, the method comprising:
providing a structure comprising:
a first glass sheet,
a single photovoltaic device disposed on the first glass sheet, and
a second glass sheet disposed over the single photovoltaic device, the first glass sheet and the second glass sheet thereby defining a gap at least a portion of which is spanned by the single photovoltaic device, wherein the single photovoltaic device is the only photovoltaic device disposed between the first and second glass sheets;
disposing only a powder consisting essentially of glass within the gap at an edge region proximate an edge of at least one of the first glass sheet or the second glass sheet, the powder being free of glass frit, frit material, organic fillers, binders, and solvents such that, before any heating of the powder, the gap and the first and second glass sheets are free of glass frit, frit material, organic fillers, binders, and solvents;
heating the powder within the gap to seal the first and second glass sheets at the edge region with a layer of melted glass powder; and
while heating the powder within the gap, applying pressure to (i) the first glass sheet, (ii) the second glass sheet, or (iii) both the first and second glass sheets,
wherein (i) a plurality of conductive bus ribbons electrically coupled to the single photovoltaic device extend out from the first and second glass sheets through the sealed edge region, (ii) at the sealed edge region, each of the conductive bus ribbons is disposed in direct mechanical contact with both the first and second glass sheets, (iii) none of the conductive bus ribbons are electrically coupled to any other photovoltaic devices disposed between the first and second glass sheets, and (iv) the plurality of conductive bus ribbons that are each electrically coupled to the single photovoltaic device are the only conductive bus ribbons disposed between the first and second glass sheets.

23. The method of claim 22, wherein the single photovoltaic device is in direct mechanical contact with one of the first and second glass sheets but not both of the first and second glass sheets.

* * * * *